(12) United States Patent
Izuchi et al.

(10) Patent No.: US 8,050,443 B2
(45) Date of Patent: Nov. 1, 2011

(54) MICROPHONE AND MICROPHONE MOUNTING STRUCTURE

(75) Inventors: Toshiro Izuchi, Fukuoka (JP); Kazuo Ono, Fukuoka (JP); Kensuke Nakanishi, Fukuoka (JP); Kiyoshi Ota, Fukuoka (JP); Tsuyoshi Baba, Fukuoka (JP)

(73) Assignee: Hosiden Corporation, Osaka (JP)

( * ) Notice: Subject to any disclaimer, the term of this patent is extended or adjusted under 35 U.S.C. 154(b) by 1034 days.

(21) Appl. No.: 11/982,501

(22) Filed: Nov. 1, 2007

(65) Prior Publication Data
US 2008/0112585 A1 May 15, 2008

(30) Foreign Application Priority Data
Nov. 10, 2006 (JP) ................................ 2006-305101

(51) Int. Cl.
 H04R 9/08 (2006.01)
 H04R 11/04 (2006.01)
 H04R 17/02 (2006.01)
 H04R 19/04 (2006.01)
 H04R 25/00 (2006.01)

(52) U.S. Cl. ......... 381/357; 381/361; 381/174; 381/191

(58) Field of Classification Search .......... 381/355–357, 381/361, 369, 178, 174, 190, 191
See application file for complete search history.

(56) References Cited

FOREIGN PATENT DOCUMENTS

| CN | 1523929 | 8/2004 |
|---|---|---|
| CN | 1615050 | 5/2005 |
| EP | 1 427 250 | 6/2004 |
| EP | 1 427 250 A2 | 6/2004 |
| EP | 1 494 503 A1 | 1/2005 |
| EP | 1 530 401 A2 | 5/2005 |
| EP | 1 748 676 A2 | 1/2007 |
| JP | S54-093309 | 7/1979 |
| JP | 08322096 | 12/1996 |
| JP | 2005-192180 | 7/2005 |
| JP | 2006-238203 | 9/2006 |

OTHER PUBLICATIONS

EP Extended Search Report, Feb. 4, 2009, Hosiden Corporation.
JP First Office Action, Feb. 17, 2009, Hosiden Corporation.
Office Action issued on Apr. 13, 2011 by the Chinese Intellectual Property Office for counterpart foreign patent application CN 2007 10303583.5.

*Primary Examiner* — Tuan Nguyen
(74) *Attorney, Agent, or Firm* — David N. Lathrop

(57) ABSTRACT

A microphone contains a capacitor in a capsule with a diaphragm serving as one of electrodes of the capacitor. The microphone is mounted on a mounting board when external terminals installed on an external surface of a circuit board which closes an opening of the capsule are connected face to face with connection terminals on the mounting board. A sound hole is formed in the circuit board and through-hole is formed in the mounting board, being placed in such a position as to avoid overlapping each other when the microphone is mounted. An enclosed space which communicates the through-hole and sound hole is formed when the external terminals are connected with the connection terminals on the mounting board.

13 Claims, 10 Drawing Sheets

PRIOR ART

MICROPHONE AND MICROPHONE MOUNTING STRUCTURE

TECHNICAL FIELD

The present invention relates to a microphone and a microphone mounting structure incorporated, for example, in a cell phone.

BACKGROUND ART

Downsizing, ease of mounting, and reduced requirements for mounting space are demanded of microphones to be mounted in such small equipment as cell phones.

Electret condenser microphones (ECM) are commonly used as such microphones that are provided with good characteristics, easy to handle because of their simple structure, and easy to downsize. They are mounted on a target mounting-board (board of a target equipment) using a surface-mount technique.

FIGS. 11A and 11B show a perspective view and sectional view of a configuration described in Japanese Patent Application Laid-Open No. 2005-192180 (hereinafter referred to as patent literature 1) as an example of a mounting structure for use to mount a microphone on a mounting board. In the figures, reference numeral 10 denotes a microphone and 20 denotes a mounting board (board of a target equipment). Incidentally, internal structure of the microphone 10 is not shown in FIG. 11B.

In this example, as shown in FIG. 11B, no sound receiving sound hole is formed in a capsule 11 which provides a shell of the microphone 10, but a sound hole 13 is formed in a circuit board 12 which covers an opening 11b of the capsule 11. External terminals 14 and 15 are formed on an external surface of the circuit board 12, and soldered to a terminal pattern (not shown) formed on the mounting board 20, thereby mounting the microphone 10 to the mounting board 20. Reference numeral 16 in FIG. 11B denotes a solder layer.

A sound receiving through-hole (sound hole) 21 is formed in the mounting board 20, and the microphone 10 is mounted with the sound hole 13 in the circuit board 12 aligned with the through-hole 21 in the mounting board 20.

With the mounting structure in this example, sound waves from a sound source are captured into inner space of the microphone 10 through the through-hole 21 in the mounting board 20 and the sound hole 13 in the circuit board 12. Thus, in this example, the mounting board 20 can be placed in the equipment in such a way that a parts-mounting surface 20a will face inward in the equipment.

That is, if a sound hole is formed in a front plate 11a on the opposite side of the capsule 11 from the circuit board 12 rather than in the circuit board 12, it is necessary to place the mounting board 20 inside the equipment so that the parts-mounting surface 20a will face the sound source (turn outward) because the sound hole must face the sound source to capture the sound waves from the sound source. In that case, it is necessary to provide a space large enough to accommodate height of the microphone between the mounting board 20 and a housing of the equipment. However, the configuration shown in FIGS. 11A and 11B eliminates the need for such a space, and thus requires less space in order to mount the microphone.

However, with the conventional mounting structure shown in FIGS. 11A and 11B, the sound hole 13 in the circuit board 12 of the microphone 10 and the through-hole 21 in the mounting board 20 are superimposed one upon the other, i.e., the sound hole 13 is placed at a location onto which the through-hole 21 is projected in a height direction of the microphone 10, making it easy for foreign matter such as dust and water droplets to get into the inner space of the microphone 10.

Also, since the positions of the sound hole 13 and through-hole 21 coincide, any foreign matter entering the through-hole 21, for example, during an assembly process or the like may damage a diaphragm in the microphone.

Furthermore, the sound waves, which enter the diaphragm directly through the through-hole 21 and the sound hole 13, are liable to cause pop noise.

SUMMARY OF THE INVENTION

In view of the above problems, an object of the present invention is to provide a microphone and its mounting structure which are difficult for foreign matter to enter, capable of preventing a diaphragm from being damaged accidentally, and able to avoid pop noise, where the microphone is structured to capture sound waves through a sound receiving through-hole formed in a mounting board on which the microphone is surface-mounted.

According to a first aspect of the present invention, a microphone comprises a diaphragm, a back plate which faces the diaphragm at a distance therefrom to form a capacitor in conjunction therewith, a capsule which houses the diaphragm and the back plate, a circuit board which closes an opening of the capsule, and an external terminal installed on an external surface of the circuit board, the microphone being adapted to be mounted on a mounting board such that the external terminal is connected face to face with a connection terminal on the mounting board, wherein at least one sound receiving sound hole is formed in the circuit board without overlapping at least one sound receiving through-hole in the mounting board in a direction perpendicular to a board surface of the circuit board when the microphone is mounted; and the external terminal has a frame-like shape and surrounds the through-hole and the sound hole, forming an enclosed space via the face-to-face connection with the connection terminal, the enclosed space communicating the through-hole and the sound hole with each other.

In the microphone, the external terminal may have a bump shape, protruding from the external surface of the circuit board.

The bump shape may be formed of a thick-film conductor pattern or a conductive member on a conductor pattern.

In the microphone, a stepped part protruding outward may be formed on the external surface of the circuit board, and the external terminal may be formed on the stepped part.

In the microphone, a stepped plate which has steps may be installed in contact with the external surface; and the stepped plate may have a recess used to form the enclosed space, and a sound hole which opens to the recess, being communicated with the sound hole in the circuit board.

In the microphone, a plurality of the sound holes may be arranged on a circle.

In the microphone, a ground pattern may be formed in an area on the external surface of the circuit board, the area being surrounded by the external terminal.

According to a second aspect of the present invention, a microphone mounting structure for mounting a microphone on a mounting board, the microphone comprising a diaphragm, a back plate which faces the diaphragm at a distance therefrom to form a capacitor in conjunction therewith, a capsule which houses the diaphragm and the back plate, a circuit board which closes an opening of the capsule, and an external terminal installed on an external surface of the circuit board and connected face to face with a connection terminal on the mounting board, wherein at least one sound receiving sound hole is formed in the circuit board without overlapping at least one sound receiving through-hole in the mounting board when the microphone is mounted in a direction perpendicular to a board surface of the circuit board; and the external terminal has a frame-like shape and surrounds the through-hole and the sound hole, forming an enclosed space via the face-to-face connection with the connection terminal, the enclosed space communicating the through-hole and the sound hole with each other.

In the mounting structure, one of the external terminal and the connection terminal may have a bump shape protruding toward the other.

The bump shape may be formed of a thick-film conductor pattern or a conductive member on a conductor pattern.

In the mounting structure, a plurality of the sound holes and a plurality of the through-holes may be arranged on concentric circles of different diameters inside the frame-like shape of the external terminal.

In the mounting structure, a ground pattern may be formed, inside the frame-like shape of the external terminal, on each of opposing faces of the circuit board and the mounting board.

DETAILED DESCRIPTION OF PREFERRED EMBODIMENTS

Embodiments of the present invention will be described with reference to the drawings.

Figure 1:
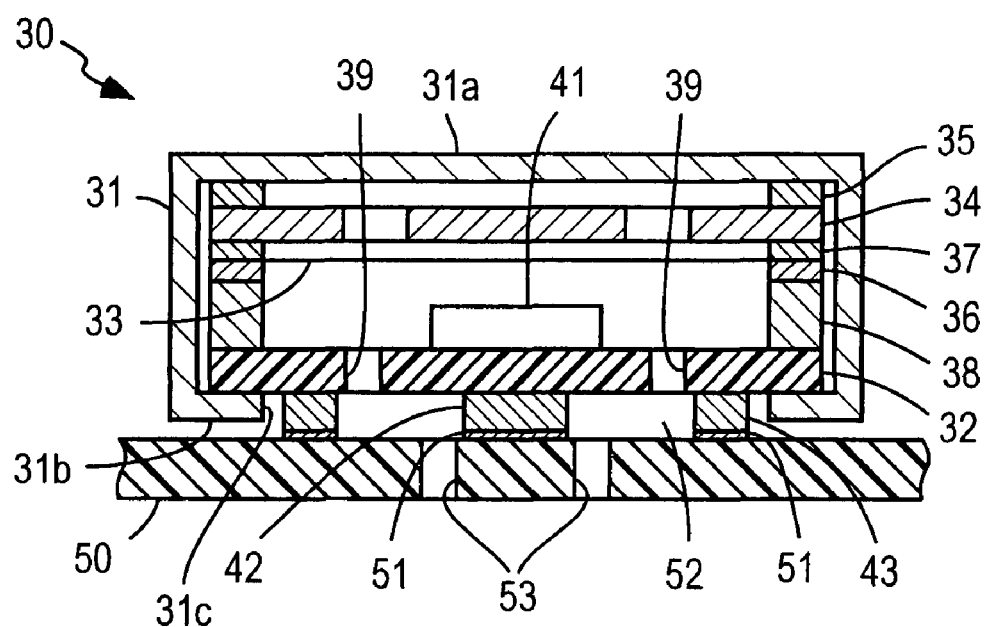
FIG. 1 is a sectional view illustrating a first embodiment of the present invention.

FIG. 1 shows a configuration of an embodiment of the microphone according to the present invention with the microphone being mounted on a target mounting-board.

In this example, the microphone 30 is an electret condenser microphone (ECM) in which an electret condenser is contained in a capsule 31 cylindrical in shape and a circuit board 32 circular in shape is housed in the capsule 31 in such as way as to close an opening 31c of the capsule 31 from inside.

The electret condenser includes a diaphragm 33, a back plate 34, and an electret (not shown) disposed on one surface of the back plate 34 which faces the diaphragm 33, the back plate 34 being disposed opposite a front plate 31a of the capsule 31. A washer ring 35 is interposed between the back plate 34 and front plate 31a.

The diaphragm 33 has its rim fixed to a support ring 36, and a ring-shaped spacer 37 is interposed between the diaphragm 33 and back plate 34 to form a predetermined clearance. The support ring 36 is held on the circuit board 32 via a gate ring 38 mounted on the circuit board 32.

To fix the circuit board 32, open ends of the capsule 31 is bent inward by crimping and the circuit board 32 is fixed under pressure by resulting crimp edges 31b.

Multiple sound holes 39 are formed in the circuit board 32, an IC device 41 for impedance conversion is mounted on an internal surface of the circuit board, and external terminals 42 and 43 for external connection are formed on an external surface. In this example, the external terminals 42 and 43 have bump shapes which protrude from the external surface of the circuit board 32 farther than the crimp edges 31b of the capsule 31.

To mount the microphone 30 on a mounting board 50, the external terminals 42 and 43 are connected face to face to terminals on the mounting board 50. The connection is made by soldering using, for example, a reflow apparatus. In FIG. 1, reference numeral 51 denotes a solder layer.

As the external terminals 42 and 43 of the microphone 30 are connected to the terminals on the mounting board 50 by soldering in this way, an enclosed space 52 is formed between the circuit board 32 and mounting board 50, communicating the sound holes 39 in the circuit board 32 with sound receiving through-holes 53 in the mounting board 50. Incidentally, the through-holes 53 in the mounting board 50 and sound holes 39 in the circuit board 32 are placed in such a position as to avoid overlapping each other in a direction perpendicular to a board surface of the mounting board 50. That is, the sound holes 39 are placed at locations other than locations onto which the through-holes 53 are projected in a height direction of the microphone 30.

Figure 2A:
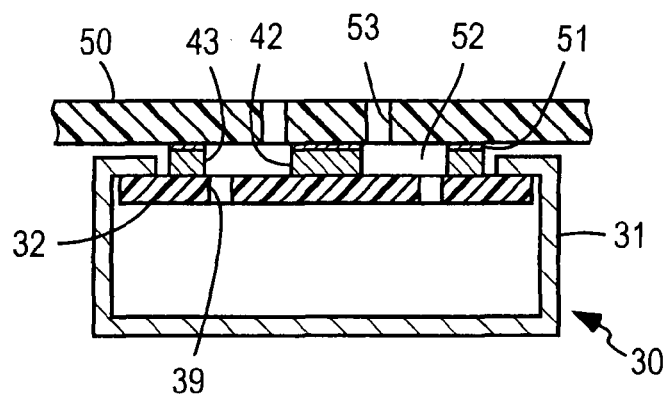
FIG. 2A is a simplified version of the sectional view in FIG. 1, shown upside down.
Figure 2B:
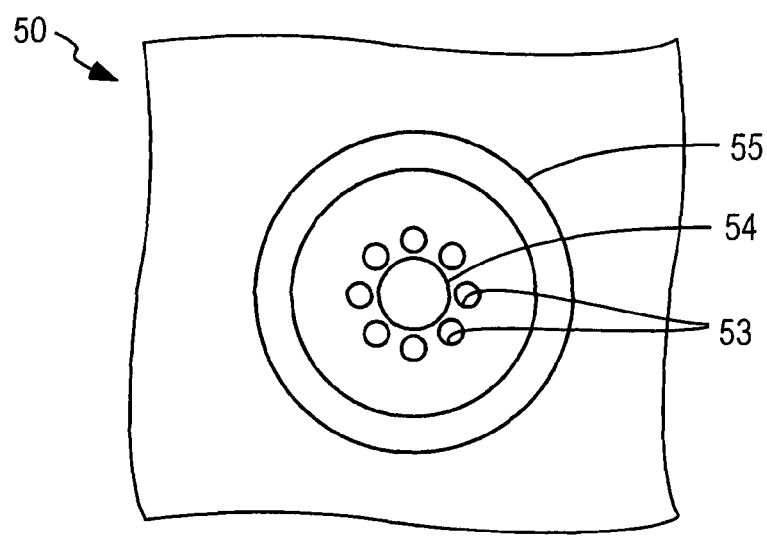
FIG. 2B is a plan view of a mounting board in FIG. 1.
Figure 2C:
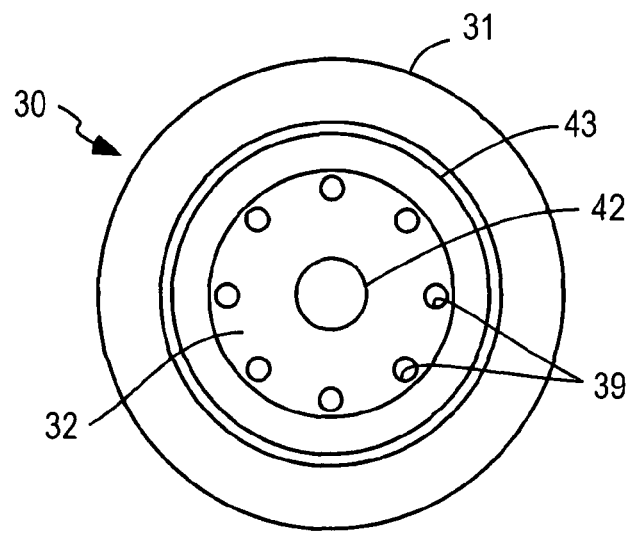
FIG. 2C is a bottom view of a microphone in FIG. 1.

FIG. 2A is a sectional view showing a mounting structure of the microphone 30 in FIG. 1 in a simplified manner. FIG. 2B is a plan view of the mounting board 50 and FIG. 2C is a bottom view of the microphone 30. As shown in FIG. 2C, the external terminal 42 formed on the circuit board 32 of the microphone 30 is circular in shape and placed in the center of the circuit board 32 circular in shape. The other external terminal 43, which is shaped like a circular frame, concentrically surrounds the external terminal 42. In this example, the external terminals 42 and 43 are formed as a result of thin-film formation of a conductor pattern. Incidentally, such a thin-film conductor pattern can also be formed by plating or by print coating a conductive paste.

The external terminal 42 is used as an output terminal while the external terminal 43 is used as a ground (GND) terminal. In this example, the sound holes 39, eight in number, are formed nearer to the external terminal 43 between the external terminals 42 and 43, and arranged at equal intervals concentrically with the external terminals 43 and 42.

On the other hand, connection terminals 54 and 55, similar in shape to the external terminals 42 and 43 of the microphone 30, are created by pattern formation on the mounting board 50 at locations corresponding to the external terminals 42 and 43 as shown in FIG. 2B. The through-holes 53 are formed between the connection terminals 54 and 55. The through-holes 53, eight in number, are formed at equal intervals concentrically with the connection terminals 54 and 55. In this example, the through-holes 53 are formed nearer to the connection terminal 54 so that they will not overlap with the sound holes 39.

As the external terminals 42 and 43 and connection terminals 54 and 55 are formed into such pattern shapes and connected face to face by soldering, a space surrounding the arrangements of the sound holes 39 and through-holes 53 is sealed by soldering, forming the enclosed space 52 between the circuit board 32 and mounting board 50.

In this example, the microphone 30 configured as described above and mounted on the mounting board 50 allows sound waves from a sound source to be captured into inner space of the microphone 30 through the through-holes 53 of the mounting board 50, enclosed space 52, and sound holes 39 in the circuit board 32 of the microphone 30.

Figure 11A:
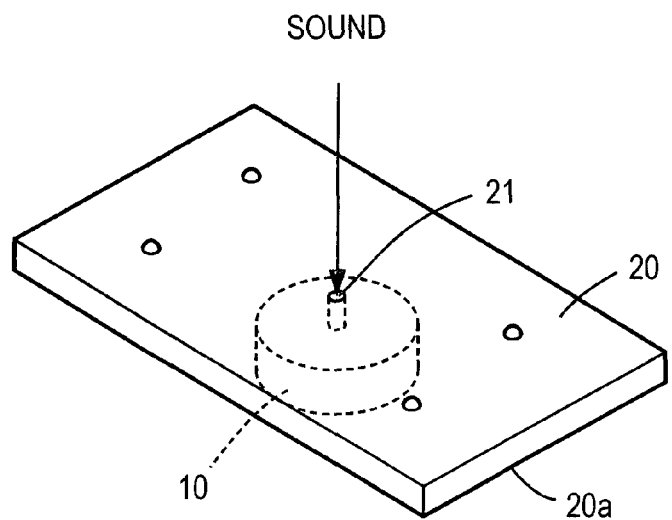
FIG. 11A is a perspective view showing a prior art example of a mounting structure for mounting a microphone on a mounting board.
Figure 11B:
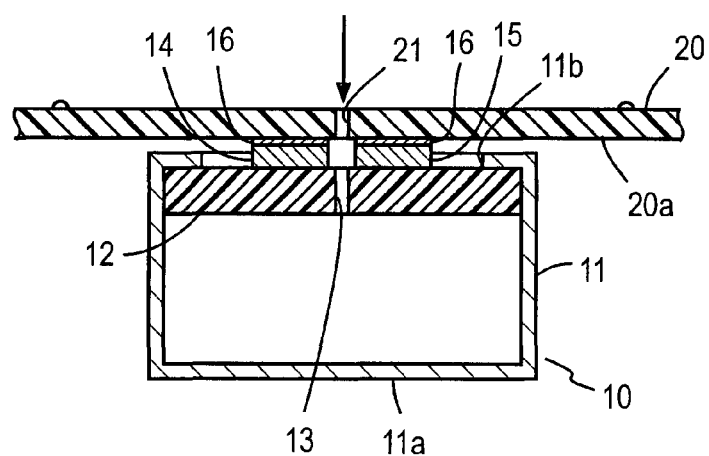
FIG. 11B is a sectional view.

In this example, unlike the mounting structure shown in FIG. 11, the sound holes 39 in the circuit board 32 and through-holes 53 in the mounting board 50 are displaced from each other without overlap, making it difficult for foreign matter such as dust and water droplets to enter and preventing the diaphragm 33 from being damaged accidentally. In addition, the sound waves entering through the through-holes 53 are diffracted in the enclosed space 52, reach the sound holes 39, and then enter the microphone 30. That is, the diffraction structure in this example prevents the sound waves from directly reaching the diaphragm 33, and thereby makes it possible to reduce pop noise.

Incidentally, although in the above example, the microphone 30 is mounted on the mounting board 50 by reflow soldering, the external terminals 42 and 43 of the microphone 30 and connection terminals 54 and 55 of the mounting board 50 may be connected using, for example, a conductive adhesive instead of solder.

Figure 3A:
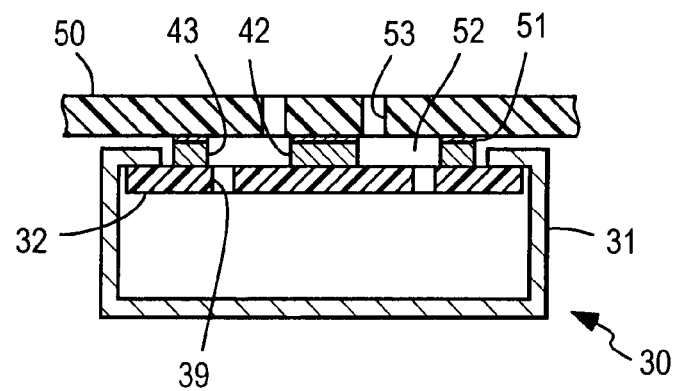
FIG. 3A is a sectional view of a second embodiment of the microphone according to the present invention.
Figure 3B:
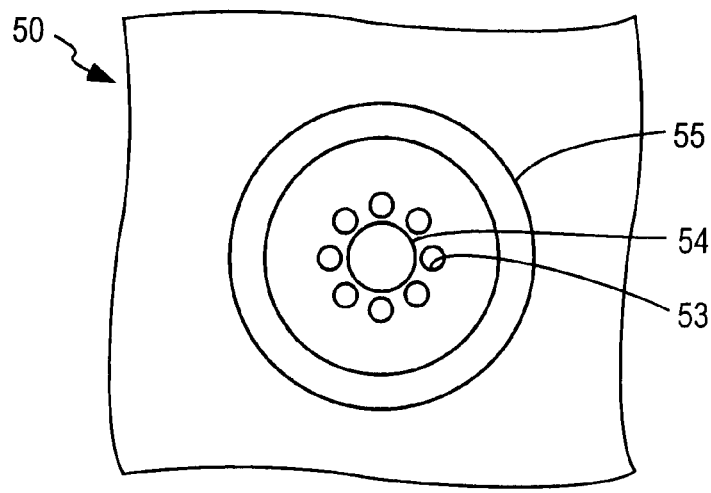
FIG. 3B is a plan view of a mounting board.
Figure 3C:
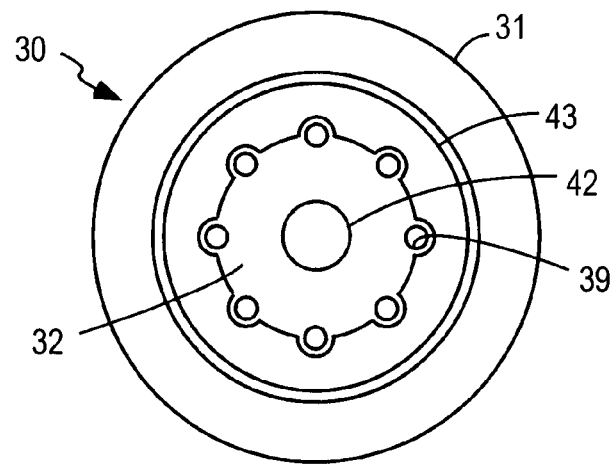
FIG. 3C is a bottom view of the microphone.

FIGS. 3A, 3B, and 3C show a configuration in which, out of the external terminals 42 and 43 formed on the circuit board 32 of the microphone 30 in FIGS. 2A, 2B, and 2C, the pattern shape of the external terminal 43 serving as a ground terminal is changed in such a way that its inner rim juts in between adjacent sound holes 39 as shown in FIG. 3C. Such a pattern shape may also be used. The rest of the configuration is similar to that shown in FIGS. 2A, 2B, and 2C.

Although in the examples shown in FIGS. 2A, 2B, and 2C and FIGS. 3A, 3B, and 3C, eight sound holes 39 and eight through-holes 53 are arranged on circles, the numbers of the sound holes 39 and through-holes 53 may be set as required including one.

Figure 4A:
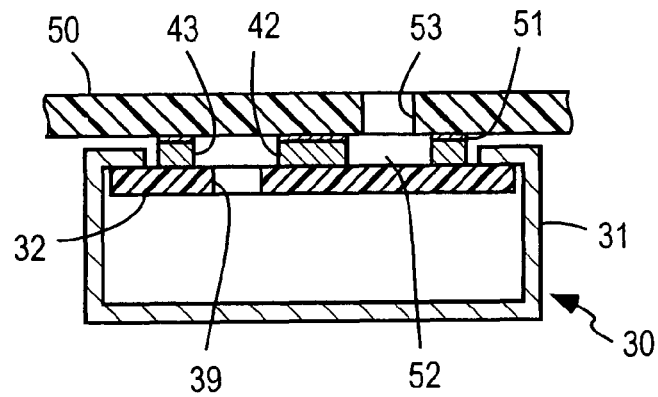
FIG. 4A is a sectional view of a third embodiment of the microphone according to the present invention.
Figure 4B:
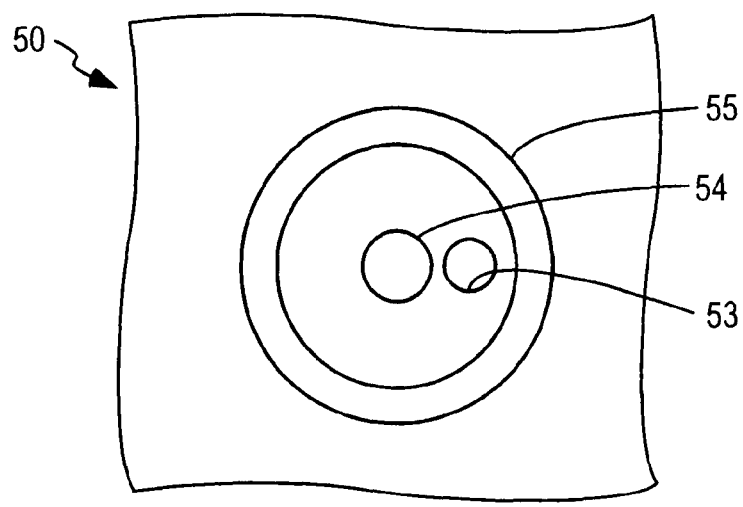
FIG. 4B is a plan view of a mounting board.
Figure 4C:
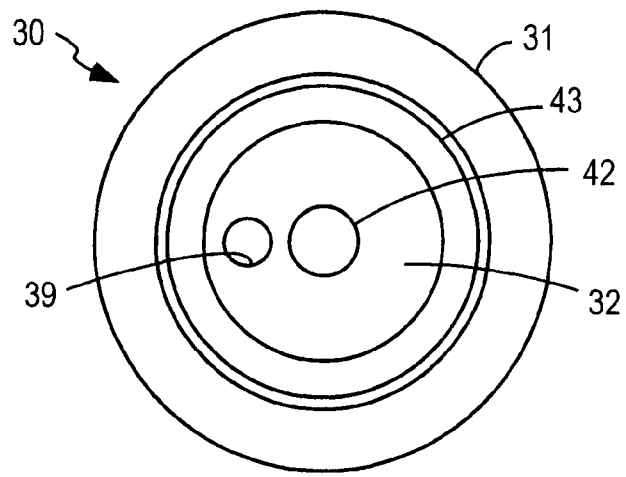
FIG. 4C is a bottom view of the microphone.

FIGS. 4A, 4B, and 4C, which correspond to FIGS. 2A, 2B, and 2C, show one through-hole 53 formed in the mounting board 50 and one sound hole 39 formed in the circuit board 32. In this example, to avoid overlap, the sound hole 39 and through-hole 53 are located 180 degrees apart from each other around a circular external terminal 42 and connection terminal 54 connected face to face with each other. The rest of the configuration is similar to that shown in FIGS. 2A, 2B, and 2C.

With the configuration shown in FIGS. 4A, 4B, and 4C, when mounting the microphone 30 on the mounting board 50, it is necessary to carry out positioning, making sure that there is no overlap between the sound hole 39 and through-hole 53. A possible method for the positioning involves putting marks on the capsule 31 of the microphone 30 and on the mounting board 50 in advance and aligning the marks to carry out positioning. Another method involves mounting the microphone 30 through image recognition using a camera.

Figure 5A:
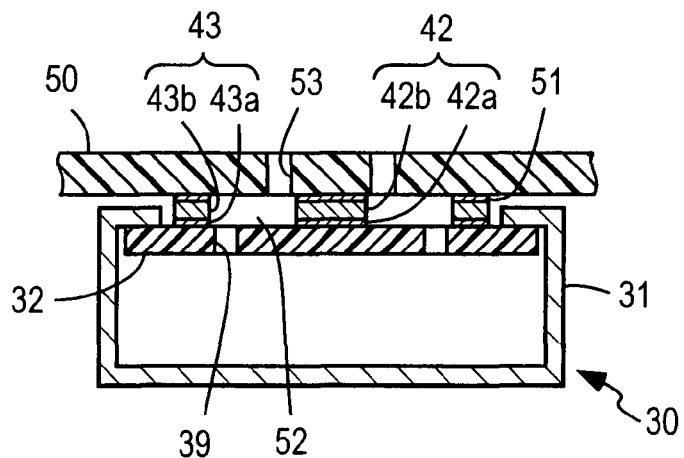
FIG. 5A is a sectional view of a fourth embodiment of the microphone according to the present invention.
Figure 5B:
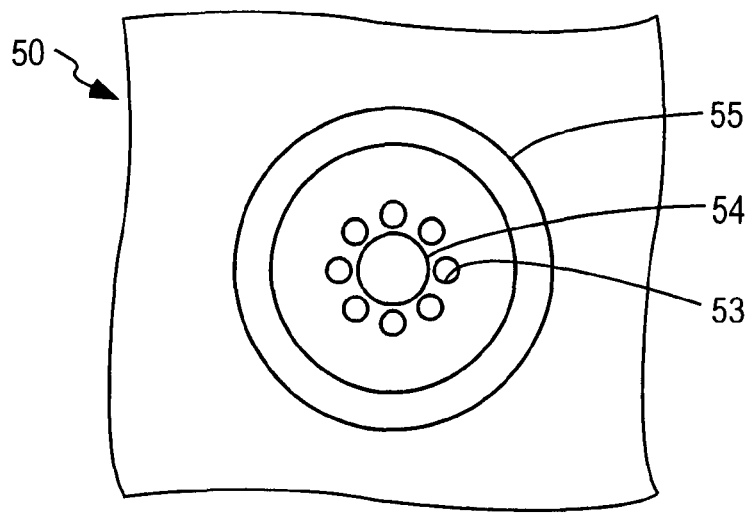
FIG. 5B is a plan view of a mounting board.
Figure 5C:
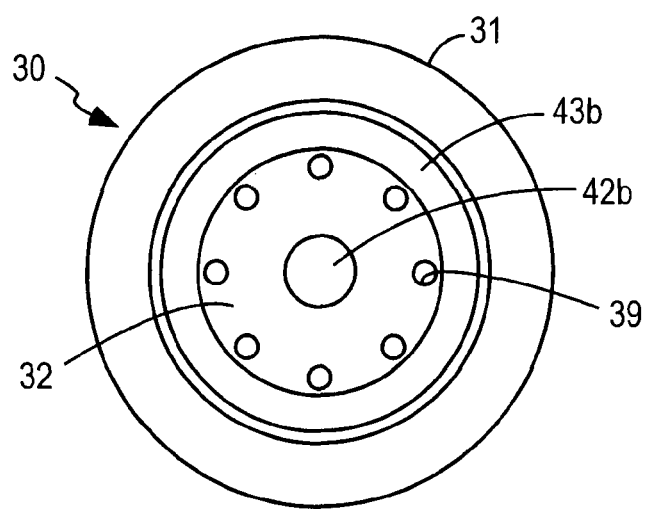
FIG. 5C is a bottom view of the microphone.

FIGS. 5A, 5B, and 5C, which correspond to FIGS. 2A, 2B, and 2C, show another example of how to form a bump shape. In this example, the bump shape is formed by arranging and fixing conductive members on conductor patterns (thin-film conductor patterns) instead of using thick-film conductor patterns. In FIG. 5A, reference characters 42a and 43a denote conductor patterns and 42b and 43b denote conductive members.

Copper or brass, for example, may be used as a constituent material of the conductive members 42b and 43b. The external terminals 42 and 43 of a bump shape are produced as the conductive members 42b and 43b are soldered onto the conductor patterns 42a and 43a, respectively. The rest of the configuration is similar to that shown in FIGS. 2A, 2B, and 2C.

In all the examples described above, the external terminals 42 and 43 of the microphone 30 have a bump shape. Alternatively, the connection terminals 54 and 55 of the mounting board 50 may have a bump shape which is formed by using a thick-film conductor pattern or placing a conductive member on a conductor pattern. By giving a bump shape to the external terminals 42 and 43 or the connection terminals 54 and 55, it is possible to form a required enclosed space 52 between the mounting board 50 and the circuit board 32 of the microphone 30. When the microphone 30 is mounted on the mounting board 50 by reflow soldering, by giving a bump shape to the external terminals 42 and 43 on the microphone 30, it is possible to prevent solder from entering (flowing around into) the microphone 30.

Figure 6A:
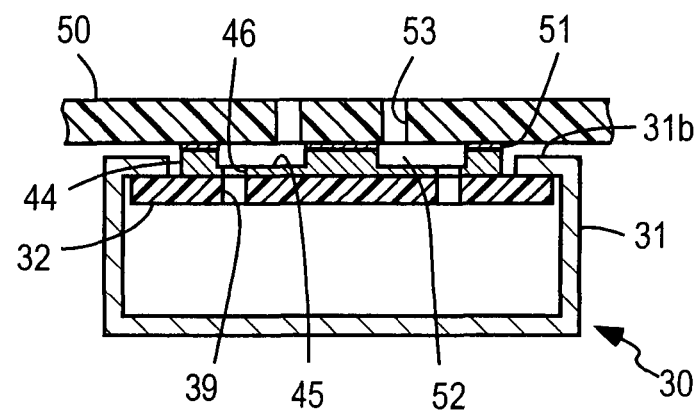
FIG. 6A is a sectional view of a fifth embodiment of the microphone according to the present invention.
Figure 6B:
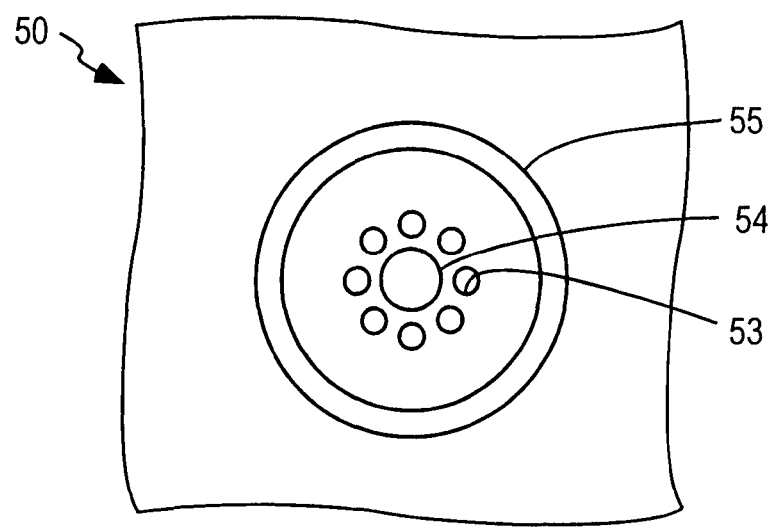
FIG. 6B is a plan view of a mounting board.
Figure 6C:
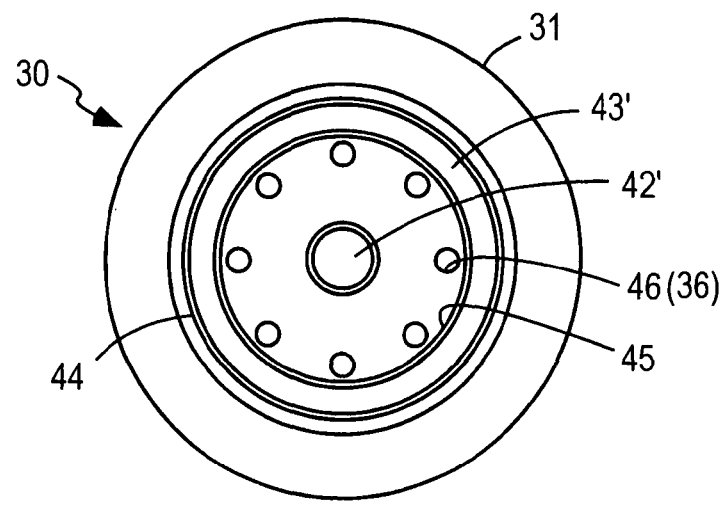
FIG. 6C is a bottom view of the microphone.

Next, an embodiment shown in FIGS. 6A, 6B, and 6C will be described.

This example involves placing a stepped plate 44 provided with steps in contact with the external surface of the circuit board 32 and creating external terminals 42' and 43' on top of the stepped plate 44 by pattern formation, instead of forming external terminals 42 and 43 of a bump shape on the circuit board 32 of the microphone 30. A recess 45 annular in shape is formed on the stepped plate 44 except where the external terminals 42' and 43' are formed. As the stepped plate 44 with the recess 45 is placed on the external surface of the circuit board 32, an enclosed space 52 is formed between the circuit board 32 and mounting board 50.

Sound holes 46 which open to the recess 45 are formed in the stepped plate 44 in communication with the sound holes 39 in the circuit board 32. Incidentally, the stepped plate 44 and circuit board 32 are integrated by joining conductor patterns formed on their opposing faces using solder or a conductive adhesive. The conductor patterns formed on that surface of the stepped plate 44 which opposes the circuit board 32 are connected with the external terminals 42' and 43' via through-holes or the like.

The use of the stepped plate 44 (shown in FIG. 6) which has steps makes it possible to easily set the external terminals 42' and 43' to desired height positions, i.e., desired positions higher than the crimp edges 31b of the capsule 31, and form the enclosed space 52.

Incidentally, although in FIG. 6, the stepped plate 44 is joined integrally to the circuit board 32 of the microphone 30, stepped parts extruding outward may be formed on the circuit board 32 itself and then patterns of the external terminals 42' and 43' may be formed on the steps.

Figure 7:
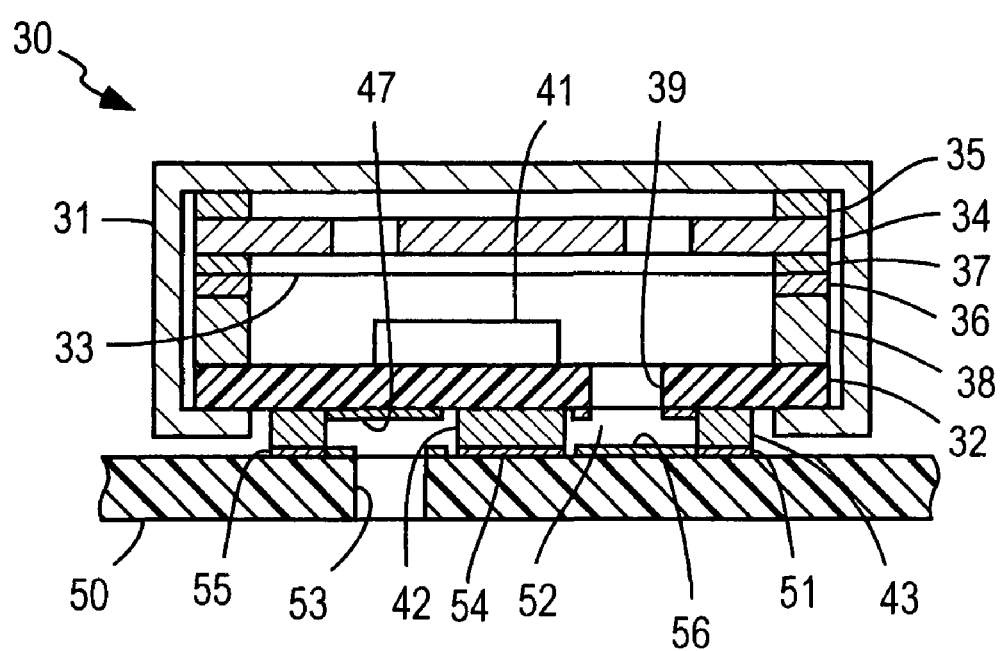
FIG. 7 is a sectional view illustrating a sixth embodiment of the present invention.

Next, an embodiment shown in FIG. 7 will be described.

In this example, one sound hole 39 and one through-hole 53 are formed in the circuit board 32 and mounting board 50, respectively, as in the case of the configuration shown in FIG. 4. Besides, annular ground patterns 47 and 56 are formed in the area between the external terminals 42 and 43 and the area between the connection terminals 54 and 55, respectively, on the opposing faces of the circuit board 32 and mounting board 50, with a clearance provided between the output terminal 42 and ground pattern 47 as well as between output terminal 54 and ground pattern 56.

The ground patterns 47 and 56 which are formed in this way on the surfaces facing the sound hole 39 and through-hole 53 make it possible to shield out electromagnetic waves entering directly and thereby suppress induction noise. Incidentally, the shielding effect of the ground patterns 47 and 56 is enhanced by the displacement between the sound hole 39 and through-hole 53. With the conventional mounting structure shown in FIG. 11 in which the sound hole 13 in the circuit board 12 of the microphone 10 coincides in position with the through-hole 21 in the mounting board 20 (i.e., they are superimposed one upon the other), sufficient shielding effect is not available, i.e., electromagnetic waves enter the inner space of the microphone even if such ground patterns are installed.

Figure 8:
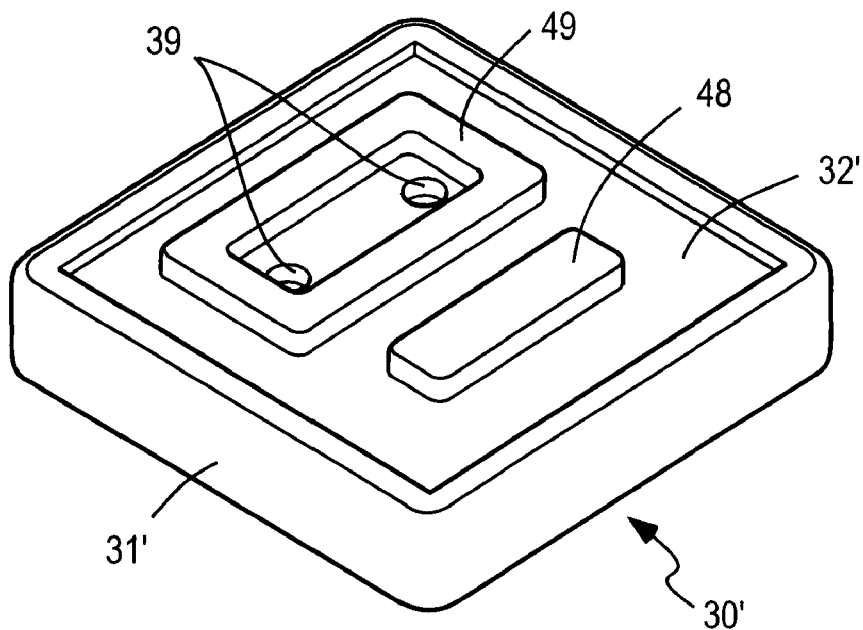
FIG. 8 is a perspective view illustrating a seventh embodiment of the present invention.

FIG. 8 shows a microphone whose external shape is square/rectangular rather than cylindrical which is the case with the above examples. An external terminal 48 rectangular in shape and external terminal 49 square in shape are formed next to each other on a circuit board 32' which closes an opening of a capsule 31'. The external terminals 48 and 49 have a bump shape.

In this example, the external terminal 48 is an output terminal and the external terminal 49 is a ground terminal. Two sound holes 39 are formed within a frame of the external terminal 49 on the circuit board 32'.

Figure 9:
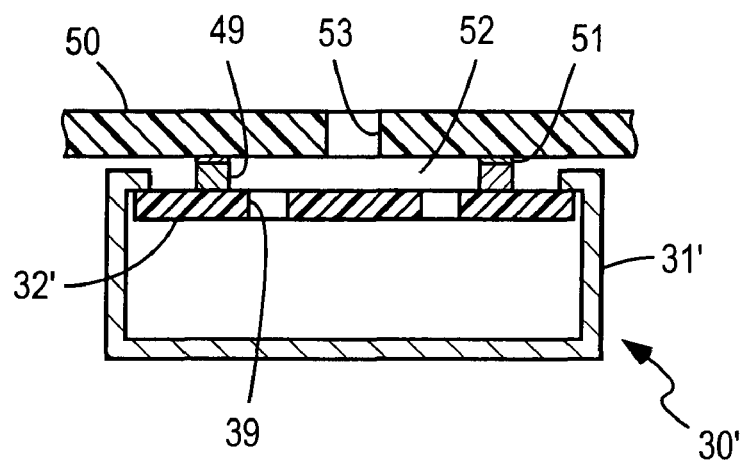
FIG. 9 is a sectional view showing a mounted state of a microphone shown in FIG. 8.
Figure 10A:
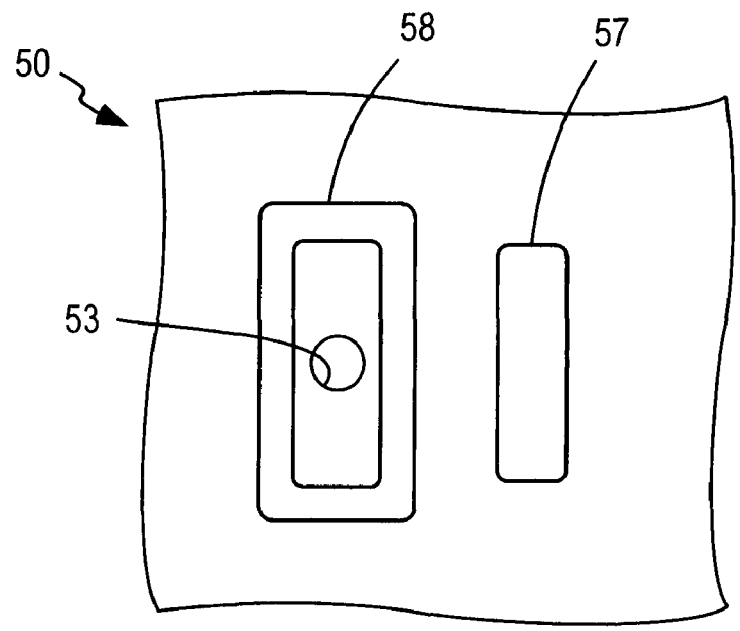
FIG. 10A is a plan view of a mounting board in FIG. 9.
Figure 10B:
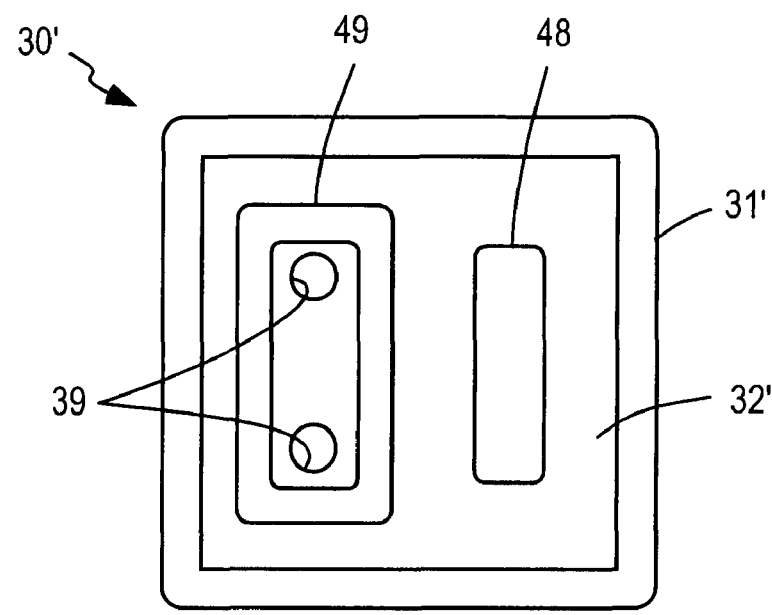
FIG. 10B is a bottom view of the microphone in FIG. 9.

FIG. 9 is a simplified view of the microphone 30' in FIG. 8 as the microphone 30' is mounted on the mounting board 50. FIGS. 10A and 10B are a plan view of the mounting board 50 and a bottom view of the microphone 30', respectively.

Patterns of connection terminals 57 and 58 are formed on the mounting board 50, corresponding to the external terminals 48 and 49. One through-hole 53 is formed in the center of a frame of the terminal 58.

When the microphone 30' is mounted on the mounting board 50, the through-hole 53 in the mounting board 50 and sound hole 39 in the circuit board 32' are located in such positions that there will be no overlap between the holes as shown in FIG. 9. An enclosed space 52 is formed between the mounting board 50 and circuit board 32' and the through-hole 53 and sound hole 39 are communicated with each other via the enclosed space 52.

Effects of the Invention

According to the present invention, a microphone is configured such that a sound hole formed in a circuit board does not overlap a sound receiving through-hole formed in a mounting board on which the microphone is mounted; therefore, it is possible to reduce foreign matter to enter the microphone, prevent a diaphragm from being damaged accidentally, and reduce pop noise.

What is claimed is:

1. A microphone mounting structure, comprising:
an electret condenser which comprises a back plate having an electret on an internal surface thereof and a diaphragm facing the electret at a distance therefrom;
a circuit board which has a sound through-hole and external terminals on an external surface thereof;
a capsule with an opening which houses the electret condenser and the circuit board so that the circuit board, at an internal surface thereof, faces the diaphragm at a distance therefrom and closes, at the external surface thereof, the opening of the capsule; and
a mounting board which has a sound receiving through-hole and connection terminals on an internal surface thereof that are disposed to correspond to the respective external terminals and are configured to be brought into contact with the corresponding external terminals, wherein
one of the external terminals has a ring shape and surrounds the sound through-hole;
one of the connection terminals corresponding to the one external terminal has a ring shape and surrounds the sound receiving through-hole;
either the external terminals or the connection terminals have a bump shape protruding from the external surface of the circuit board or the internal surface of the mounting board and the other terminals, the connection terminals or the external terminals, have a conductor pattern; and
the circuit board is mounted on the mounting board such that the external terminals contact the corresponding connection terminals, so that the ring-shaped one external terminal and the corresponding ring-shaped one connection terminal that are in contact with each other form an enclosed space between the circuit board and the mounting board, and that the sound through-hole and the sound receiving through-hole are placed within the enclosed space at different locations not to overlap each other in a direction perpendicular to the circuit board, whereby the enclosed space constitutes a sound diffraction structure for sound waves communicating between the sound through-hole and the sound receiving through-hole.

2. The microphone mounting structure according to claim 1, wherein the external terminals have a bump shape, protruding from the external surface of the circuit board.

3. The microphone mounting structure according to claim 2, wherein the bump shape is formed of a thick-film conductor pattern.

4. The microphone mounting structure according to claim 2, wherein the bump shape is formed of a conductive member on a conductor pattern that is formed on the external surface of the circuit board.

5. The microphone mounting structure according to claim 1, wherein the external surface of the circuit board has a stepped part protruding outward; and the external terminals are formed on the stepped part.

6. The microphone mounting structure according to claim 1, wherein the external terminals are formed on steps of a stepped plate that is installed in contact with the external surface of said circuit board and provided with the step, the stepped plate having a recess that forms the enclosed space, and through-holes which open to the recess and communicated with the sound through-holes in the circuit board.

7. The microphone mounting structure according to claim 1, wherein a plurality of the sound through-holes are arranged at positions on a circle inside the one ring-shaped external terminal.

8. The microphone mounting structure according to claim 1, wherein ground patterns are formed, inside the one ring-shaped external terminal on the external surface of the circuit board and inside the one ring-shaped connection terminal on the internal surface of the mounting board thereby suppressing induction noise.

9. The microphone mounting structure according to claim 1, wherein the connection terminals have a bump shape protruding from the internal surface of the mounting board.

10. The microphone mounting structure according to claim 9, wherein the bump shape is formed of a thick-film conductor pattern.

11. The microphone mounting structure according to claim 9, wherein the bump shape is formed of a conductive member on a conductor pattern.

12. The microphone mounting structure according to claim 1, wherein a plurality of the sound through-holes are arranged on a first circle on the external surface of the circuit board inside the one ring-shaped external terminal, and a plurality of the sound receiving through-holes are arranged on a second circle on the internal surface of the mounting board inside the one ring-shaped connection terminal, the first circle and the second circle having different diameters and being concentric.

13. The microphone mounting structure according to claim 1, wherein ground patterns are formed, inside the ring-shaped external terminal, on opposing faces of the circuit board and the mounting board.

* * * * *